United States Patent
Sottke et al.

(10) Patent No.: US 9,427,808 B2
(45) Date of Patent: Aug. 30, 2016

(54) REFRACTORY COATINGS FOR CUTTING TOOLS

(71) Applicant: Kennametal Inc., Latrobe, PA (US)

(72) Inventors: Volkmar Sottke, Mulheim (DE); Karl Heinz Wendt, Ebermannstadt (DE); Hartmut Westphal, Dermbach (DE); Peter Leicht, Latrobe, PA (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 79 days.

(21) Appl. No.: 14/014,968

(22) Filed: Aug. 30, 2013

(65) Prior Publication Data

US 2015/0064431 A1     Mar. 5, 2015

(51) Int. Cl.
| | |
|---|---|
| B32B 9/00 | (2006.01) |
| B23B 27/14 | (2006.01) |
| C23C 16/30 | (2006.01) |
| C23C 16/40 | (2006.01) |
| C23C 16/458 | (2006.01) |

(52) U.S. Cl.
CPC ............ *B23B 27/148* (2013.01); *C23C 16/308* (2013.01); *C23C 16/403* (2013.01); *C23C 16/405* (2013.01); *C23C 16/4582* (2013.01); *B23B 2222/16* (2013.01); *B23B 2222/28* (2013.01); *B23B 2222/88* (2013.01); *B23B 2224/32* (2013.01); *B23B 2224/36* (2013.01); *B23B 2226/18* (2013.01); *Y10T 428/24975* (2015.01); *Y10T 428/31678* (2015.04)

(58) Field of Classification Search
USPC ............ 51/307, 309; 428/216, 325, 336, 697, 428/698, 699, 701, 702
See application file for complete search history.

(56) References Cited

U.S. PATENT DOCUMENTS

| | | | | |
|---|---|---|---|---|
| 4,180,400 | A | * | 12/1979 | Smith et al. .................... 428/469 |
| 4,357,382 | A | * | 11/1982 | Lambert et al. ............... 428/699 |
| RE32,111 | E | | 4/1986 | Lambert et al. |
| 4,707,384 | A | | 11/1987 | Schachner et al. |
| 4,746,563 | A | | 5/1988 | Nakano et al. |
| 4,749,629 | A | * | 6/1988 | Sarin et al. .................... 428/701 |
| 4,749,630 | A | | 6/1988 | Konig et al. |

(Continued)

FOREIGN PATENT DOCUMENTS

| | | |
|---|---|---|
| EP | 704880 A2 | 4/1996 |
| EP | 784101 B1 | 8/1999 |

(Continued)

OTHER PUBLICATIONS

MOLTRECHT, Machine Shop Practice, International Press Inc., New York, New York (1981) pp. 199-204.

(Continued)

*Primary Examiner* — Archene Turner
(74) *Attorney, Agent, or Firm* — Larry R. Meenan (57) ABSTRACT

In one aspect, cutting tools are described having coatings adhered thereto which, in some embodiments, demonstrate desirable wear resistance and increased cutting lifetimes. A coated cutting tool described herein comprises a substrate and a coating adhered to the substrate, the coating including a refractory layer comprising plurality of sublayer groups, a sublayer group comprising an aluminum oxynitride (AlON) sublayer or a composite AlON sublayer and an alumina ($Al_2O_3$) sublayer or composite alumina sublayer.

41 Claims, 7 Drawing Sheets

(56) References Cited

U.S. PATENT DOCUMENTS

| | | |
|---|---|---|
| 4,950,558 A | 8/1990 | Sarin |
| 5,071,696 A | 12/1991 | Chatfield et al. |
| 5,075,265 A | 12/1991 | Narula |
| 5,494,743 A | 2/1996 | Woodard et al. |
| 5,500,279 A | 3/1996 | Walter et al. |
| 5,618,626 A | 4/1997 | Nagashima et al. |
| 5,665,431 A | 9/1997 | Narasimhan |
| 5,700,569 A * | 12/1997 | Ruppi ............................ 428/336 |
| 5,709,907 A | 1/1998 | Battaglia et al. |
| 5,722,803 A | 3/1998 | Battaglia et al. |
| 5,750,267 A | 5/1998 | Takase et al. |
| 6,007,908 A | 12/1999 | Reece et al. |
| 6,010,283 A | 1/2000 | Henrich et al. |
| 6,022,174 A | 2/2000 | Husvik et al. |
| 6,156,383 A | 12/2000 | Ishii et al. |
| 6,161,990 A | 12/2000 | Oles et al. |
| 6,183,846 B1 | 2/2001 | Moriguchi et al. |
| 6,254,984 B1 | 7/2001 | Iyori |
| 6,426,137 B1 | 7/2002 | Oshika et al. |
| 6,528,180 B1 | 3/2003 | Lee et al. |
| 6,652,922 B1 | 11/2003 | Forester et al. |
| 6,660,371 B1 | 12/2003 | Westphal et al. |
| 6,811,880 B1 | 11/2004 | Clough |
| 6,811,881 B1 | 11/2004 | Clough |
| 6,835,446 B2 | 12/2004 | Ueda et al. |
| 6,838,179 B1 | 1/2005 | Legrand |
| 6,924,037 B1 | 8/2005 | Joret et al. |
| 6,933,065 B2 | 8/2005 | Arendt et al. |
| 7,005,189 B1 | 2/2006 | Tachibana et al. |
| 7,087,295 B2 | 8/2006 | Okada et al. |
| 7,244,520 B2 | 7/2007 | Kumakura et al. |
| 7,258,927 B2 | 8/2007 | Foltyn et al. |
| 7,322,776 B2 | 1/2008 | Webb et al. |
| 7,410,707 B2 | 8/2008 | Fukui et al. |
| 7,531,213 B2 | 5/2009 | Bjormander |
| 7,541,102 B2 | 6/2009 | Klippe et al. |
| 7,544,410 B2 | 6/2009 | Lengauer et al. |
| 7,592,077 B2 | 9/2009 | Gates, Jr. et al. |
| 7,608,335 B2 | 10/2009 | Findikoglu et al. |
| 7,659,002 B2 | 2/2010 | Coster et al. |
| 7,704,611 B2 | 4/2010 | Coddet et al. |
| 7,727,934 B2 | 6/2010 | Foltyn et al. |
| 7,736,728 B2 | 6/2010 | Loboda et al. |
| 7,745,009 B2 | 6/2010 | Decroupet et al. |
| 7,758,950 B2 | 7/2010 | Moriguchi et al. |
| 7,782,569 B2 | 8/2010 | Cheng et al. |
| 7,785,700 B2 | 8/2010 | Okada et al. |
| 7,829,194 B2 | 11/2010 | Brady et al. |
| 7,972,684 B2 | 7/2011 | Hara et al. |
| 7,981,516 B2 | 7/2011 | Labrousse et al. |
| 8,003,231 B2 | 8/2011 | Yamamoto |
| 8,017,244 B2 | 9/2011 | Hevesi |
| 8,080,323 B2 | 12/2011 | Ban et al. |
| 8,119,226 B2 | 2/2012 | Reineck et al. |
| 8,192,793 B2 | 6/2012 | Sandberg et al. |
| 8,247,080 B2 | 8/2012 | Iacovangelo et al. |
| 9,017,809 B2 * | 4/2015 | Sottke et al. ................. 428/325 |
| 2003/0044652 A1 | 3/2003 | Wang |
| 2003/0108752 A1 * | 6/2003 | Konig et al. .................. 428/698 |
| 2003/0134039 A1 | 7/2003 | Ross et al. |
| 2003/0175557 A1 | 9/2003 | Anderson et al. |
| 2004/0076764 A1 | 4/2004 | Forester et al. |
| 2004/0209126 A1 | 10/2004 | Ziegler et al. |
| 2005/0008883 A1 | 1/2005 | Takagi et al. |
| 2005/0025973 A1 | 2/2005 | Slutz et al. |
| 2005/0064247 A1 | 3/2005 | Sane et al. |
| 2006/0008676 A1 | 1/2006 | Ebata et al. |
| 2006/0019118 A1 | 1/2006 | Gates, Jr. et al. |
| 2006/0093758 A1 | 5/2006 | Sakakura et al. |
| 2006/0127699 A1 | 6/2006 | Moelle et al. |
| 2006/0159912 A1 | 7/2006 | Haldeman |
| 2006/0182991 A1 | 8/2006 | Tauchi et al. |
| 2006/0204772 A1 | 9/2006 | Mukunoki et al. |
| 2006/0234064 A1 | 10/2006 | Baubet et al. |
| 2006/0240266 A1 | 10/2006 | Schicht et al. |
| 2007/0030569 A1 | 2/2007 | Lu et al. |
| 2007/0172696 A1 | 7/2007 | Tong et al. |
| 2008/0050614 A1 * | 2/2008 | Holzschuh .................... 428/698 |
| 2008/0118762 A1 | 5/2008 | Morimoto et al. |
| 2008/0240876 A1 * | 10/2008 | Elkouby et al. ............... 428/216 |
| 2010/0062245 A1 | 3/2010 | Martin et al. |
| 2010/0132762 A1 | 6/2010 | Graham, Jr. et al. |
| 2010/0242265 A1 | 9/2010 | Wadley et al. |
| 2010/0247930 A1 | 9/2010 | Zurbuchen |
| 2010/0255337 A1 | 10/2010 | Langhorn |
| 2011/0016946 A1 | 1/2011 | Brahmandam et al. |
| 2011/0102968 A1 | 5/2011 | Choi et al. |
| 2011/0151173 A1 | 6/2011 | Ramadas et al. |
| 2012/0144965 A1 | 6/2012 | Engstrom |
| 2012/0168034 A1 | 7/2012 | Chang et al. |
| 2012/0207948 A1 | 8/2012 | Lee |
| 2012/0237794 A1 | 9/2012 | Sottke et al. |
| 2012/0258294 A1 | 10/2012 | Leyder et al. |
| 2012/0258295 A1 | 10/2012 | Leyder et al. |

FOREIGN PATENT DOCUMENTS

| | | |
|---|---|---|
| EP | 1724811 A2 | 11/2006 |
| EP | 1980649 A1 | 10/2008 |
| GB | 2 038 370 A | 7/1980 |
| JP | S60127905 A | 7/1985 |
| WO | 98/37254 A2 | 8/1998 |
| WO | 2005118505 A1 | 12/2005 |
| WO | 2006005067 A2 | 1/2006 |
| WO | 2006007728 A1 | 1/2006 |
| WO | 2007001337 A2 | 1/2007 |
| WO | 2007005925 A1 | 1/2007 |
| WO | 2007018974 A2 | 2/2007 |

OTHER PUBLICATIONS

ASTE, Tool Engineers Handbook McGraw Hill Book Co, New York, New York (1949) pp. 302-315.
GB Search Report dated Mar. 31, 2015 corresponding to application No. GB1415234.2, 1 page.

* cited by examiner

REFRACTORY COATINGS FOR CUTTING TOOLS

FIELD

The present invention relates to coatings for cutting tools and, in particular, to coatings deposited by chemical vapor deposition (CVD).

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multilayer constructions of the foregoing refractory materials have increasingly reached their performance limits, thereby calling for the development of new coating architectures for cutting tools.

SUMMARY

In one aspect, cutting tools are described herein having coatings adhered thereto which, in some embodiments, can demonstrate desirable wear resistance and increased cutting lifetimes. Briefly, a coated cutting tool described herein comprises a substrate and a coating adhered to the substrate, the coating including a refractory layer comprising plurality of sublayer groups, a sublayer group comprising an aluminum oxynitride sublayer or composite aluminum oxynitride sublayer and an alumina sublayer or composite alumina sublayer. The coating adhered to the cutting tool substrate, in some embodiments, further comprises one or more inner layers between the refractory layer and the substrate and/or one or more outer layers deposited over the refractory layer.

In another aspect, methods of making coated cutting tools are described herein. A method of making a coated cutting tool comprises providing a substrate a depositing over the substrate by chemical vapor deposition a coating including a refractory layer comprising a plurality of sublayer groups, a sublayer group comprising an aluminum oxynitride sublayer or composite aluminum oxynitride sublayer and an alumina sublayer or composite alumina sublayer. In some embodiments, one or more inner coating layers are deposited over the substrate prior to deposition of the refractory layer. Further, one or more outer layers can be deposited over the refractory layer.

These and other embodiments are described further in the detailed description which follows.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coated Cutting Tools

In one aspect, cutting tools are described having coatings adhered thereto which, in some embodiments, demonstrate desirable wear resistance and increased cutting lifetimes. A coated cutting tool described herein comprises a substrate and a coating adhered to the substrate, the coating including a refractory layer comprising plurality of sublayer groups, a sublayer group comprising an aluminum oxynitride (AlON) sublayer or a composite AlON sublayer and an alumina ($Al_2O_3$) sublayer or composite alumina sublayer. The coating adhered to the cutting tool substrate, in some embodiments, further comprises one or more inner layers between the refractory layer and the substrate and/or one or more outer layers deposited over the refractory layer.

Turning now to specific components, coated cutting tools described herein comprise a substrate. A coated cutting tool can comprise any substrate not inconsistent with the objectives of the present invention. A substrate, in some embodiments, is an end mill, drill or indexable cutting insert. Indexable cutting inserts can have any desired ANSI standard geometry for milling or turning applications. Substrates of coated cutting tools described herein can be formed of cemented carbide, carbide, ceramic, cermet or steel. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 3 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide cutting tool substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

Figure 1:
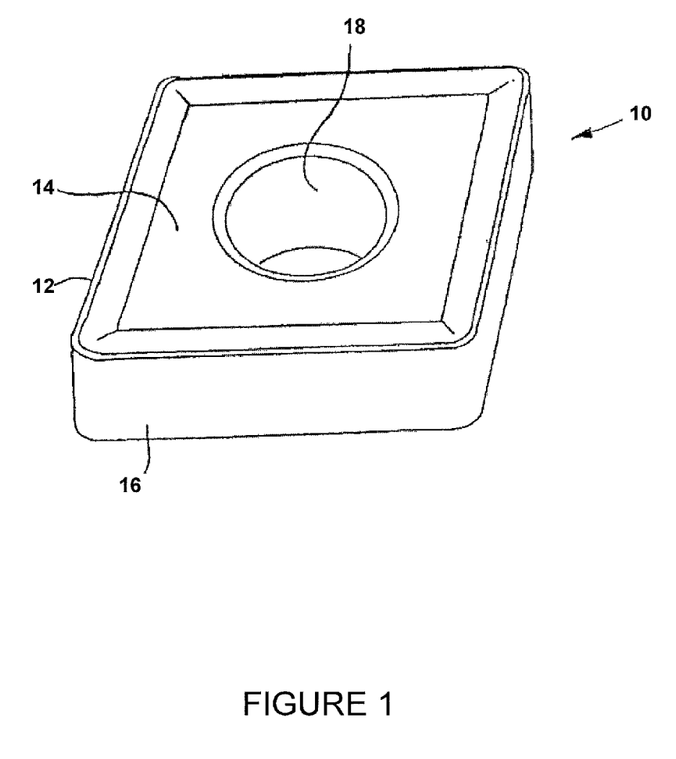
FIG. 1 illustrates a cutting tool substrate according to one embodiment described herein.

A cutting tool substrate can comprise one or more cutting edges formed at the juncture of a rake face and flank face(s) of the substrate. FIG. 1 illustrates a cutting tool substrate according to one embodiment described herein. As illustrated in FIG. 1, the substrate (10) has cutting edges (12) formed at junctions of the substrate rake face (14) and flank faces (16). The substrate (10) also comprises an aperture (18) for securing the substrate (10) to a tool holder.

As described herein, a coating adhered to the substrate comprises a refractory layer including a plurality of sublayer groups, a sublayer group comprising an AlON sublayer or composite AlON sublayer and an alumina sublayer or composite alumina sublayer. Sublayer groups of the refractory layer can be adjacent to another or spaced apart from one another by intervening layer(s) in the refractory layer. Further, any desired number of sublayer groups can form the refractory layer. In some embodiments, for example, the refractory layer comprises at least four sublayer groups.

Individual sublayer groups can demonstrate various constructions. In some embodiments, at least one sublayer group of the refractory layer can have a construction selected from Table I.

TABLE I

Sublayer Group Constructions of Refractory Layer

Composite AlON sublayer/Composite Al$_2$O$_3$ sublayer
Composite AlON sublayer/Al$_2$O$_3$ sublayer
AlON sublayer/Composite Al$_2$O$_3$ sublayer
AlON sublayer/Al$_2$O$_3$ sublayer Further, sublayer groups forming a refractory layer described herein can have the same or different constructions. In some embodiments, for example, sublayer groups forming the refractory layer have a single construction selected from Table I, such as composite AlON sublayer/composite Al$_2$O$_3$ sublayer. Alternatively, sublayer groups forming the refractory layer can have differing constructions selected from Table I. Any combination of sublayer group constructions derived from Table I are contemplated. For example, a first sublayer group of the refractory layer can comprise a composite AlON sublayer and a composite alumina sublayer and a second sublayer group comprising a composite AlON sublayer and an alumina sublayer.

Turning now to specific sublayers, an AlON sublayer can be polycrystalline demonstrating hexagonal crystalline structure, cubic crystalline structure of a mixture of hexagonal and cubic crystalline structures. Alternatively, the MON sublayer is amorphous. Further, the AlON sublayer can display a mixture of crystalline and amorphous structures, wherein the crystalline structures are hexagonal, cubic or a combination thereof. The MON sublayer can also demonstrate a fine grain structure with grains having sizes in the range of 10 nm to 2 µm.

Aluminum, nitrogen and oxygen contents of an AlON sublayer can be varied according to the CVD parameters selected. Aluminum of an AlON sublayer, for example, can range from 20 to 50 atomic %. In some embodiments, aluminum of the AlON is in the range of 25 to 40 atomic % or 32 to 38 atomic %. Nitrogen of an AlON sublayer can range from 40 to 70 atomic %. In some embodiments, nitrogen of the AlON is in the range of 55 to 70 atomic % or 63 to 67 atomic percent. Further, oxygen of an AlON sublayer can range from 1 to 20 atomic %. In some embodiments, oxygen of the AlON is in the range of 2 to 15 atomic % or 4 to 6 atomic %.

Moreover, a composite AlON sublayer comprises an AlON phase and a metal oxide phase including one or more oxides of metallic elements of Group IVB of the Periodic Table. The AlON phase can be present in the composite sublayer in any amount not inconsistent with the objectives of the present invention. The AlON phase, for example, can be the major phase of the composite sublayer serving as a matrix for the metal oxide and metal oxynitride phases discussed further herein. In some embodiments, the AlON phase is present in the composite sublayer in an amount selected from Table II.

TABLE II

AlON Phase of Composite AlON Sublayer (Volume Percent)
AlON Phase (vol. %)

≥50
≥60
≥70
≥80
85-99
90-99

Aluminum, nitrogen and oxygen contents of an AlON phase can be varied according to the CVD parameters selected. Aluminum of the AlON phase, for example, can range from 20 to 50 atomic %. In some embodiments, aluminum of the AlON phase is in the range of 25 to 40 atomic % or 32 to 38 atomic %. Nitrogen of the AlON phase can range from 40 to 70 atomic %. In some embodiments, nitrogen of the AlON phase is in the range of 55 to 70 atomic % or 63 to 67 atomic percent. Further, oxygen of the AlON phase can range from 1 to 20 atomic %. In some embodiments, oxygen of the AlON phase is in the range of 2 to 15 atomic % or 4 to 6 atomic %.

The AlON phase, in some embodiments, is polycrystalline. For example, the AlON phase can display a hexagonal crystalline structure, cubic crystalline structure or mixture of hexagonal and cubic crystalline structures. Alternatively, the AlON phase is amorphous. Further, the AlON phase can display a mixture of crystalline and amorphous structures, wherein the crystalline structures are hexagonal, cubic or a combination thereof. The AlON phase can also exhibit a fine grain structure with grains having sizes in the range of 10 nm to 2 µm.

As described herein, a composite AlON sublayer also comprises a metal oxide phase including at least one oxide of a metallic element selected from Group IVB of the Periodic Table. The metal oxide phase, for example, can comprise ZrO$_2$ or HfO$_2$. The metal oxide phase, in some embodiments, comprises a plurality of oxides of metallic elements selected from Group IVB of the Periodic Table. The metal oxide phase, for example, can comprise a mixture of ZrO$_2$ and HfO$_2$. The metal oxide phase can be a minor phase of the composite AlON sublayer, being contained or dispersed in the AlON matrix phase. In some embodiments, the metal oxide phase is present in the AlON composite sublayer in an amount selected from Table III.

TABLE III

Metal Oxide Phase of Composite AlON Sublayer (Volume Percent)
Metal Oxide Phase (Vol. %)

1-15
2-12
3-10

The metal oxide phase of a composite AlON sublayer, in some embodiments, is polycrystalline. For example, the metal oxide phase can display a cubic crystalline structure, monoclinic crystalline structure or tetragonal crystalline structure or mixtures thereof. The metal oxide phase can also demonstrate a fine grain structure with grains having sizes in the range of 10 nm to 2 μm. Grains of the metal oxide phase can have a spherical or elliptical geometry.

A composite AlON sublayer can further comprise a metal oxynitride phase in addition to the AlON and metal oxides phases, the metal oxynitride phase comprising at least one oxynitride of a metallic element selected from Group IVB of the Periodic Table. The metal oxynitride phase, for example, can comprise titanium oxynitride (TiON). In some embodiments, the metal oxynitride phase comprises a plurality of oxynitrides of metallic elements selected from Group IVB. A metal oxynitride phase, in some embodiments, is of the formula $MO_xN_{1-x}$, wherein M is selected from metallic elements of Group IVB of the Periodic Table and x=0.1-0.9.

The metal oxynitride phase can be polycrystalline. In such embodiments, the metal oxynitride phase can demonstrate a cubic crystalline structure. Further, the metal oxynitride phase can exhibit an ultrafine grain structure with grains having sizes in the range of 1 nm to 20 nm. The metal oxynitride phase can be a minor phase of the composite AlON sublayer being contained or dispersed in the AlON matrix phase. In some embodiments, for example, the metal oxynitride phase is present in the composite layer in an amount selected from Table IV.

TABLE IV

| Metal Oxynitride Phase of the Composite AlON Sublayer (Volume Percent) |
| --- |
| Metal Oxynitride Phase (Vol. %) |
| 0-10 |
| 0.5-10 |
| 1-9 |
| 2-8 |

The volume percentages of the AlON phase, metal oxide phase and metal oxynitride phase of an AlON composite sublayer described herein can be determined using glow discharge optical emission spectroscopy (GDOES) and energy dispersive X-ray spectroscopy (EDX/EDS). In one embodiment, for example, the composition of a composite AlON sublayer can be analyzed by GDOES using GDA750 Glow Discharge Spectrometer (Spectrum Analytic Ltd. of Hof, Germany) with spot diameter of 1.0 mm. The sputtered material removal for analysis can be administered with 0.5 μm steps from the top of the sublayer to the substrate side. Further, additional analysis of coating sublayers can be conducted by EDS using scanning electron microscopy equipment LEO 430i (LEO Ltd. of Oberkochen, Germany) with analysis system of LINK ISIS (Oxford Ltd.)

As described herein, a sublayer group also comprises an alumina sublayer or composite alumina sublayer. An alumina sublayer can be polycrystalline exhibiting any alumina polymorph not inconsistent with the objectives of the present invention. In some embodiments, for example, an alumina sublayer is formed of α-alumina, κ-alumina or mixtures (α/κ) thereof.

Moreover, a composite alumina sublayer can adopt several constructions. In some embodiments, a composite alumina sublayer comprises an alumina phase and a metal oxide phase comprising one or more oxides of metallic elements of Group IVB of the Periodic Table. In some embodiments, for example, metal oxide phase of a composite alumina layer is formed of zirconia, hafnia or mixtures thereof. Ratio of alumina phase to metal oxide phase can range from 1:10 to 10:1. Further, the metal oxide phase can comprise titanium oxide $(TiO_x)$ in addition to zirconia and/or hafnia. When present, titanium oxide can be a minor constituent of the metal oxide phase and is finely dispersed throughout the composite alumina sublayer. In being finely dispersed, titanium oxide can have a grain size less than grain sizes of the alumina phase and zirconia and/or hafnia.

The alumina phase of the composite alumina sublayer can be polycrystalline exhibiting any alumina polymorph not inconsistent with the objectives of the present invention. In some embodiments, for example, an alumina phase is formed of α-alumina, κ-alumina or mixtures (α/κ) thereof. In some embodiments, a composite alumina layer has a construction described in U.S. Pat. No. 6,660,371 which is incorporated herein by reference in its entirety.

Alternatively, in another aspect, a composite alumina sublayer is formed of alumina doped with one or more metallic elements of Group IVB of the Periodic Table. In some embodiments, the alumina is doped with titanium, zirconium or mixtures thereof. In some embodiments, the alumina is doped with titanium, zirconium or mixtures thereof in an amount of 0.01-5 wt. % of the composite alumina sublayer.

AlON, composite AlON, alumina and composite alumina sublayers can have any thicknesses not inconsistent with the objectives of the present invention. These sublayers, for example, can each have an individual thickness less than 1 μm or less than 0.5 μm. In some embodiments, a sublayer has a thickness of 0.1-0.8 μm or 0.2-0.5 μm. Additionally, an alumina sublayer or composite alumina sublayer can have hardness less than the adjacent AlON sublayer or composite AlON sublayer of the sublayer group. For example, an alumina sublayer or composite alumina sublayer can have hardness (HV0.05) ranging from about 1500 to 1800, wherein HV0.05 refers to Vickers Hardness using a 0.05 kilogram-force load. The AlON or composite AlON sublayer can have hardness (HV0.05) of about 1700 to 2200. Vickers hardness values recited herein are determined according to ASTM E 384, "Standard Method for Knoop and Vickers Hardness of Materials," ASTM International.

As described further herein, sublayer groups forming the refractory layer can be adjacent to one another. Alternatively, sublayer groups of the refractory layer can be spaced apart from one another by one or more intervening layers. Further, the refractory layer can comprise any number of sublayer groups not inconsistent with the objectives of the present invention. In some embodiments, the refractory layer comprises at least four sublayer groups, each sublayer group having a construction selected from Table I herein. In comprising a plurality of sublayer groups, the refractory layer can have a thickness greater than 5 μm. In some embodiments, the refractory layer has a thickness of 5 μm to 25 μm or 6 μm to 20 μm.

Figure 2:
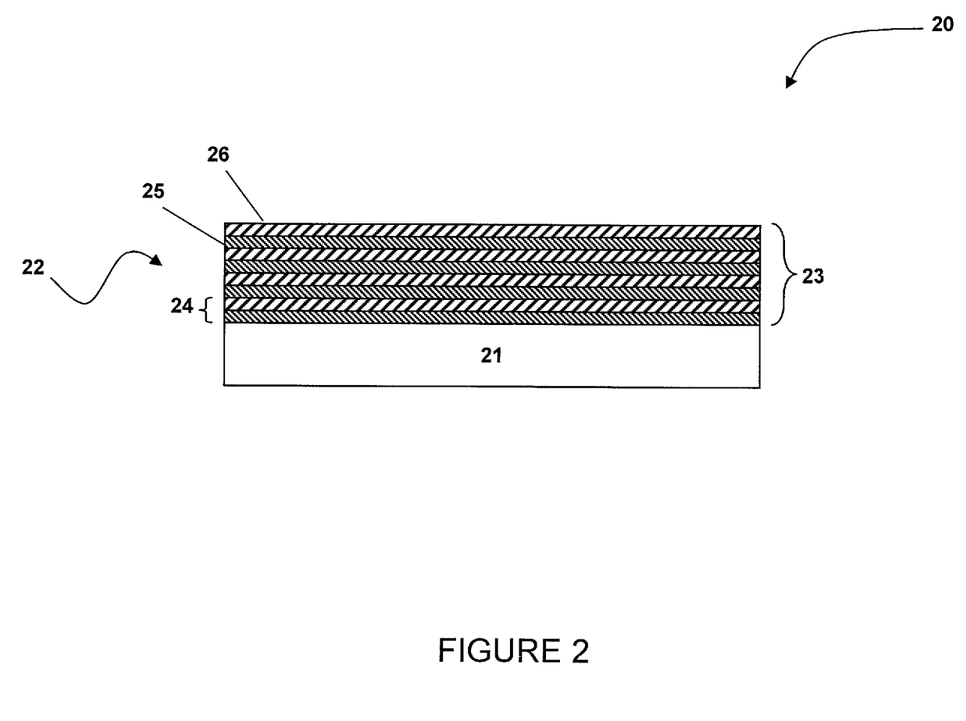
FIG. 2 illustrates a schematic of a coated cutting tool according to one embodiment described herein.

A refractory layer comprising a plurality of sublayer groups, in some embodiments, is deposited directly on the cutting tool substrate surface. FIG. 2 is a schematic of a coated cutting tool according to one embodiment wherein the refractory layer is deposited directly on the cutting tool substrate surface. The coated cutting tool (20) of FIG. 2 comprises a cutting tool substrate (21) and a coating (22) adhered to the substrate (21). The coating (22) is formed of a refractory layer (23) having a plurality of sublayer groups (24). In the embodiment of FIG. 2, the refractory layer (23) is formed of four sublayer groups (24), each sublayer group comprising an AlON sublayer or a composite AlON sublayer (26) and an alumina sublayer or composite alumina sublayer (25).

Alternatively, a coating described herein can further comprise one or more inner layers between the refractory layer and the substrate. Inner layer(s), in some embodiments, comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more inner layers between the substrate and refractory layer comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more inner layers are selected from the group consisting of titanium nitride, titanium carbonitride, titanium oxycarbonitride, titanium carbide, titanium oxide, zirconium oxide, zirconium nitride, zirconium carbonitride, hafnium nitride, hafnium carbonitride and alumina and mixtures thereof. An alumina inner layer can comprise α-alumina, κ-alumina or α/κ-alumina.

Inner layers of coatings described herein can have any thickness not inconsistent with the objectives of the present invention. Coating inner layer(s) can have a thickness ranging from 0.5 μm to 15 μm. In some embodiments, thickness of an inner layer is selected according to the position of the inner layer in the coating. An inner layer deposited directly on a surface of the substrate as an initial layer of the coating, for example, can have thickness ranging from 0.5 to 2.5 μm. An inner layer deposited over the initial layer, such as a TiCN or TiN layer, can have thickness ranging from 2 μm to 12 μm. Further, an inner layer on which a refractory layer described herein is deposited, such as a layer comprising alumina, can have a thickness ranging from 0.1 to 6 μm.

In some embodiments, a refractory layer described herein is the outermost layer of the coating. Alternatively, a coating described herein can comprise one or more outer layers over the refractory layer. Outer layer(s) can comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. Outer layer(s) over the refractory layer can comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium oxycarbonitride, titanium carbide, zirconium nitride, zirconium carbonitride, hafnium nitride, hafnium carbonitride and alumina and mixtures thereof.

Outer layers of coatings described herein can have any thickness not inconsistent with the objectives of the present invention. A coating outer layer, in some embodiments, can have a thickness ranging from 0.5 μm to 5 μm.

Additionally, in some embodiments, a coating described herein can comprise one or more bonding layers. A bonding layer can demonstrate various positions in a coating described herein. In some embodiments, a bonding layer is disposed between two inner layers of the coating, such as between a titanium nitride or titanium carbonitride inner layer and an inner layer comprising alumina. A bonding layer can also be disposed between an inner layer and the refractory layer described herein. Further, a bonding layer can be disposed between the refractory layer and an outer layer of the coating. In some embodiments, bonding layers are used to increase adhesion between layers of the coating and/or nucleate the desired morphology of a coating layer deposited on the bonding layer. A bonding layer, in some embodiments, is of the formula $M(O_xC_yN_z)$, wherein M is a metal selected from the group consisting of metallic elements of Groups IVB, VB and VIB of the Periodic Table and $x \geq 0$, $y \geq 0$ and $z \geq 0$ wherein $x+y+z=1$. For example, in one embodiment, a bonding layer of TiC is employed between an inner layer of TiCN and an inner layer comprising alumina.

A bonding layer of the formula $M(O_xC_yN_z)$ can have any thickness not inconsistent with the objectives of the present invention. In some embodiments, an $M(O_xC_yN_z)$ layer has a thickness of about 0.5 μm. Moreover, an $M(O_xC_yN_z)$ layer can have a thickness ranging from 0.5 μm to 5 μm.

Figure 3:
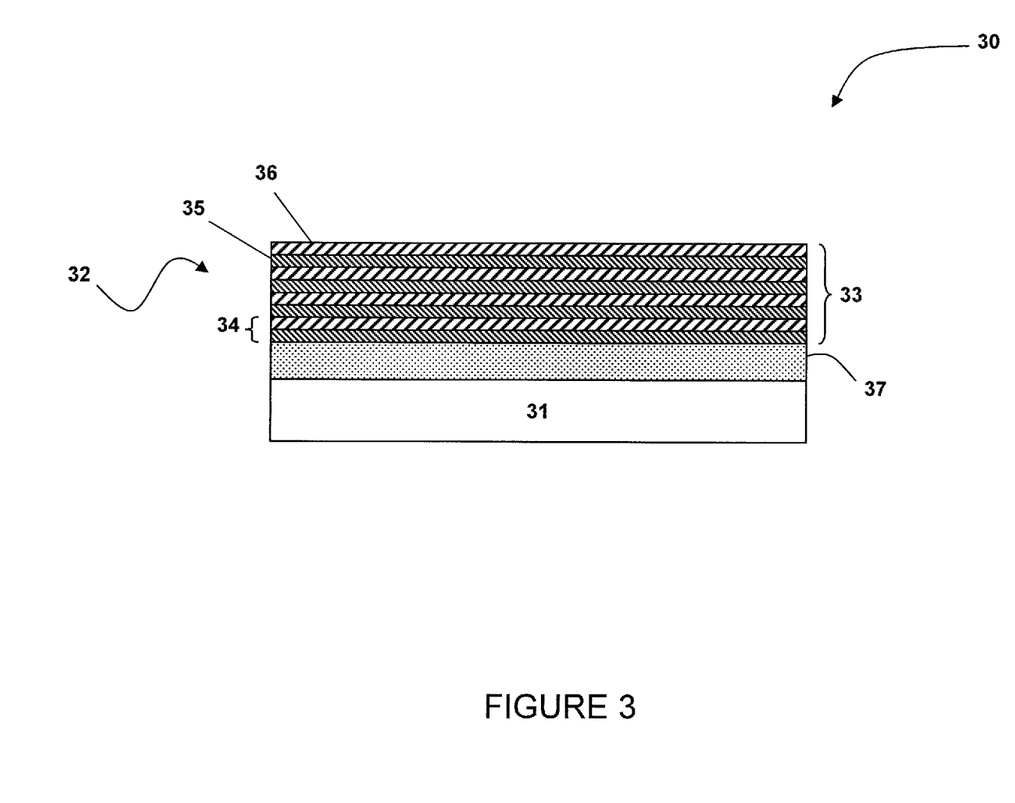
FIG. 3 illustrates a schematic of a coated cutting tool according to one embodiment described herein.

FIG. 3 illustrates a schematic of a coated cutting tool according to one embodiment wherein the refractory layer is deposited on an inner layer of the coating. The coated cutting tool (30) of FIG. 3 comprises a cutting tool substrate (31) and a coating (32) adhered to the substrate (31). The coating (32) comprises a refractory layer (33) having a plurality of sublayer groups (34). As in FIG. 2, the refractory layer (33) is formed of four sublayer groups (34), each sublayer group comprising an AlON sublayer or a composite AlON sublayer (36) and an alumina sublayer or composite alumina sublayer (35). An inner layer (37) of the coating is posited between the refractory layer (33) and the cutting tool substrate (31). As described herein, the inner layer (37) can be a single layer or multiple layers.

A coating adhered to a cutting tool substrate can have any architecture of refractory layer, inner layer(s) and/or outer layer(s) described herein. In some embodiments, a coating has an architecture selected from Table V. With reference to Table V, inner layers are listed beginning with the layer deposited directly on the substrate surface and proceed outward to the refractory layer. Further, each parenthetical structure listed for the refractory layer [e.g. (Composite $Al_2O_3$/Composite AlON)] refers to a sublayer group with the first sublayer group listed being in contact with the last inner layer listed. For example, in the first coating architecture of Table V, the refractory layer is formed of four sublayer groups of (Composite $Al_2O_3$/Composite AlON) adjacent to one another. The Composite $Al_2O_3$ sublayer of the first sublayer group is in contact with the terminal inner layer of $Al_2O_3$.

TABLE V

| Coating Architectures | | |
|---|---|---|
| Inner Layer(s) | Refractory Layer | Outer Layer |
| TiN—TiCN(MT)*-TiOCN—ZrCN—$Al_2O_3$ | (Composite $Al_2O_3$/Composite AlON)<br>(Composite $Al_2O_3$/Composite AlON)<br>(Composite $Al_2O_3$/Composite AlON)<br>(Composite $Al_2O_3$/Composite AlON) | TiOCN** or ZrCN** |

TABLE V-continued

| Coating Architectures | | |
|---|---|---|
| Inner Layer(s) | Refractory Layer | Outer Layer |
| TiN—TiCN(MT)-TiOCN—Al$_2$O$_3$ | (Composite Al$_2$O$_3$/Composite AlON) (Composite Al$_2$O$_3$/Composite AlON) (Composite Al$_2$O$_3$/Composite AlON) (Composite Al$_2$O$_3$/Composite AlON) | TiOCN** or ZrCN** |

*MT = Medium Temperature CVD
**Optional

Sublayer constructions listed in Table V can have any compositional parameters and/or properties described for the same in this Section I. For example, a composite Al$_2$O$_3$ sublayer can comprise an alumina phase and a metal oxide phase. Alternatively, the composite Al$_2$O$_3$ sublayer is formed of alumina doped with one or more metallic elements of Group IVB of the Periodic Table.

II. Methods of Making Coated Cutting Tools

In another aspect, methods of making coated cutting tools are described herein. A method of making a coated cutting tool comprises providing a substrate a depositing over the substrate by chemical vapor deposition a coating including a refractory layer comprising a plurality of sublayer groups, a sublayer group comprising an AlON sublayer or composite AlON sublayer and an alumina sublayer or composite alumina sublayer. The substrate and sublayers of AlON, composite AlON, alumina and composite alumina can have any construction and/or properties recited for the same in Section I herein.

An AlON sublayer can be deposited from a gaseous mixture comprising an aluminum source, oxygen source and nitrogen source. In some embodiments, for example, an AlON sublayer is deposited from a gaseous mixture comprising AlCl$_3$, H$_2$, N$_2$, NH$_3$, HCl and CO$_2$. General CVD processing parameters for depositing an AlON sublayer are provided in Table VI.

TABLE VI

AlON Sublayer CVD Processing Parameters
Ranges of Processing Parameters for AlON Sublayer

| Temperature | 750-1020° C. |
|---|---|
| Pressure | 50-100 mbar |
| Time | 30-120 min. |
| H$_2$ | Balance |
| N$_2$ | 30-65 vol. % |
| AlCl$_3$ | 0.5-2 vol. % |
| NH$_3$ | 1-2 vol. % |
| CO$_2$ | 0.1-1.5 vol. % |
| HCl | 2-6 vol. % |
| CO | 0-2 vol. % |
| Ar | 0-25 vol. % |

Compositional percentages of aluminum, oxygen and nitrogen of an AlON sublayer described in Section I herein can be achieved by varying amounts of individual reactant gases in the mixture.

Moreover, a composite AlON sublayer can be deposited from a gaseous mixture comprising an aluminum source, oxygen source, nitrogen source and source for metallic element(s) of Group IVB. In some embodiments, for example, the aluminum source is AlCl$_3$, and the metallic element source is a Group IVB metal chloride, such as ZrCl$_4$, HfCl$_4$ or mixtures thereof. Further, as described herein, a composite AlON layer can also comprise a metal oxynitride phase in addition to the AlON and metal oxide phases, wherein the metal of the oxynitride phase is selected from metallic elements of Group IVB of the Periodic Table. In some embodiments, the metal oxynitride phase comprises titanium oxynitride (TiON). Titanium chloride (TiCl$_4$), for example, can be added to the gaseous mixture for the deposition of a TiON phase in the MON sublayer.

Compositional percentages of phases in the composite AlON sublayer as set forth in Tables II-IV herein can be achieved by varying amounts of individual reactant gases in the deposition mixture. Additionally, compositional percentages of aluminum, nitrogen and oxygen of the AlON phase as set forth in Section I above can be achieved by varying amounts of individual reactant gases in the mixture. General CVD processing parameters for depositing a composite AlON sublayer are provided in Table VII.

TABLE VII

Composite AlON Sublayer CVD Processing Parameters
Ranges of Processing Parameters for Composite AlON Sublayer

| Temperature | 900-1000° C. |
|---|---|
| Pressure | 50-100 mbar |
| Time | 30-120 min. |
| H$_2$ | Balance |
| AlCl$_3$ | 1-4 vol. % |
| MCl$_4$* | 0.5-3 vol. % |
| NH$_3$ | 1-4 vol. % |
| CO$_2$ | 1-5 vol. % |
| HCl | 2-6 vol. % |
| Ar | 0-25 vol % |
| CO | 0-2 vol % |
| TiCl$_4$** | 0.1-2 vol. % |

*M = Group IVB Metal(s)
**Optional

An alumina sublayer can be deposited from a gaseous mixture of AlCl$_3$, H$_2$, CO$_2$, HCl and optionally H$_2$S. General CVD processing parameters for depositing an alumina sublayer are provided in Table VIII.

TABLE VIII

Alumina Sublayer CVD Processing Parameters
Ranges of Processing Parameters for Alumina Sublayer

| Temperature | 900-1000° C. |
|---|---|
| Pressure | 50-100 mbar |
| Time | 30-120 min. |
| H$_2$ | Balance |
| AlCl$_3$ | 1-5 vol. % |
| CO$_2$ | 1-5 vol. % |
| HCl | 2-6 vol. % |
| H$_2$S* | 0.1-0.6 vol. % |

*Optional

As described herein, a composite alumina sublayer can adopt several constructions. In some embodiments, a composite alumina sublayer comprises an alumina phase and a metal oxide phase comprising one or more oxides of metallic elements of Group IVB of the Periodic Table. The metal oxide phase, for example, can be formed zirconia, hafnia or mixtures thereof. In some embodiments, the metal oxide phase can further comprise titanium oxide. General CVD processing parameters for depositing a composite alumina sublayer including an alumina phase and metal oxide phase are provided in Table IX.

TABLE IX

Composite Alumina Sublayer CVD Processing Parameters
Ranges of Processing Parameters for Composite Alumina Sublayer

| | |
|---|---|
| Temperature | 900-1000° C. |
| Pressure | 50-100 mbar |
| Time | 30-120 min. |
| $H_2$ | Balance |
| $AlCl_3$ | 1-5 vol. % |
| $MCl_4$* | 0.2-3 vol. % |
| $CH_4$ | 3-6 vol. % |
| $CO_2$ | 1-5 vol. % |
| HCl | 2-6 vol. % |
| $TiCl_4$** | 0.1-1.5 vol. % |

*M = Group IVB Metal(s)
**Optional

A composite alumina layer can also be formed of alumina doped with one or more metallic elements of Group IVB of the Periodic Table. In some embodiments, alumina is doped with titanium, zirconium or mixtures thereof in an amount of 0.01-5 wt. % of the composite alumina sublayer. General CVD deposition parameters for a polycrystalline titanium and/or zirconium doped alumina sublayer are provided in Table X.

TABLE X

CVD Parameters for Ti, Zr Doped $Al_2O_3$ Sublayer deposition

| Gas Mixture | Temperature (° C.) | Pressure (mbar) | Duration (minutes) |
|---|---|---|---|
| $H_2$, $AlCl_3$, $ZrCl_4$, $TiCl_4$, $CO_2$, $H_2S$*, HCl* | 800-1500 | 40-150 | 10-600 |

*Optional $ZrCl_4$ and $TiCl_4$ can be added or removed from the gaseous mixture depending on desired alumina doping scheme.

A refractory layer comprising a plurality of sublayer groups can be deposited directly on a surface of the cutting tool substrate. Alternatively, the refractory layer is deposited on an inner layer of the coating. A coating inner layer can have any construction, compositional parameters and/or properties recited in Section I above for an inner layer. An inner layer can comprise one or more metallic elements selected from the group consisting of aluminum and metallic elements of Groups IVB, VB, and VIB of the Periodic Table and one or more non-metallic elements selected from the group consisting of non-metallic elements of Groups IIIA, IVA, VA and VIA of the Periodic Table. In some embodiments, an inner layer is a carbide, nitride, carbonitride, oxycarbonitride, oxide or boride of one or more metallic elements selected from the group consisting of aluminum and metallic elements of Groups IVB, VB and VIB of the Periodic Table. An inner layer over which a composite layer is deposited, for example, can be selected from the group consisting of titanium nitride, titanium carbide, titanium carbonitride, titanium oxycarbonitride, titanium oxide, zirconium oxide, zirconium nitride, zirconium carbonitride, hafnium nitride, hafnium carbonitride and alumina and mixtures thereof.

As described herein, a plurality of coating inner layers can reside between the cutting tool substrate and refractory layer. General CVD deposition parameters for various inner layers are provided in Table XI.

TABLE XI

CVD Parameters for Inner layer deposition

| Base Layer Composition | Gas Mixture | Temperature (° C.) | Pressure (torr) | Duration (minutes) |
|---|---|---|---|---|
| TiN | $H_2$, $N_2$, $TiCl_4$ | 800-900 | 60-300 | 20-60 |
| TiCN(MT) | $H_2$, $N_2$, $TiCl_4$, $CH_3CN$ | 750-900 | 30-120 | 60-300 |
| TiCN(HT) | $H_2$, $N_2$, $TiCl_4$, $CH_4$ | 900-1050 | 30-300 | 30-100 |
| TiOCN | $H_2$, $N_2$, $TiCl_4$, $CH_4$, CO | 900-1050 | 60-500 | 30-100 |
| $Al_2O_3$ | $H_2$, $AlCl_3$, $CO_2$, $H_2S$*, HCl | 900-1000 | 40-150 | 60-300 |

*Optional

In some embodiments of methods described herein, one or more outer layers are deposited over the refractory layer. An outer layer of the coating can have any construction, compositional parameters and/or properties recited in Section I hereinabove for an outer layer. An outer layer, for example, can comprise one or more metallic elements selected from the group consisting of aluminum and one or more metallic elements of Groups IVB, VB, and VIB of the Periodic Table and one or more non-metallic elements selected from the group consisting of non-metallic elements of Groups IIIA, IVA, VA and VIA of the Periodic Table. In some embodiments, an outer layer is a carbide, nitride, carbonitride, oxycarbonitride, oxide or boride of one or more metallic elements selected from the group consisting of aluminum and metallic elements of Groups IVB, VB and VIB of the Periodic Table. An outer layer can be selected from the group consisting of titanium nitride, titanium carbide, titanium carbonitride, titanium oxycarbonitride, titanium oxide, zirconium oxide, zirconium nitride, zirconium carbonitride, hafnium nitride, hafnium carbonitride and alumina and mixtures thereof.

These and other embodiments are further illustrated in the following non-limiting examples.

Example 1

Coated Cutting Tool

Figure 4:
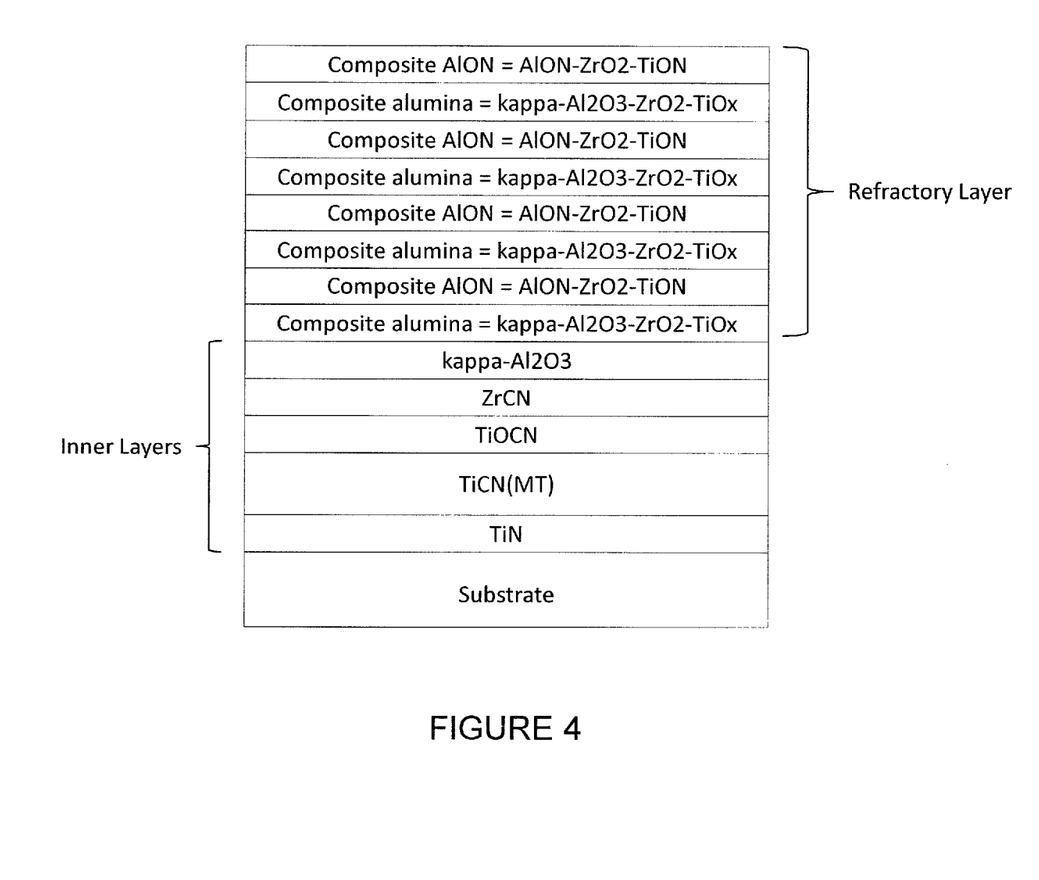
FIG. 4 illustrates a schematic of a coated cutting tool according to one embodiment described herein.

A coated cutting tool described herein was produced by placing a cemented tungsten carbide (WC—Co) cutting insert substrate [ANSI standard geometry HNPJ0905ANSNGD] into a Bernex 200 CVD reactor. The cutting insert comprised 6 wt. % cobalt binder with the balance WC grains of size 1-5 μm. A coating comprising a refractory layer having a plurality of sublayer groups was deposited on the WC—Co cutting insert according to Tables XII-XIII. Specifically, the refractory layer was comprised of four adjacent sublayer groups, each sublayer group formed of a composite AlON sublayer and composite alumina sublayer. The composite AlON sublayer was of the construction AlON—$ZrO_2$—TiON, and the composite alumina sublayer was of the construction κ-$Al_2O_3$—$ZrO_2$—$TiO_x$. Depositions of the composite alumina sublayers and composite AlON sublayers were administered in alternating fashion to form the refractory layer. Further, the refractory layer was deposited over an inner layer structure of TiN—TiCN(MT)-TiOCN—ZrCN—$Al_2O_3$. FIG. 4 is a schematic of the coating architecture of the present example.

Figure 5:
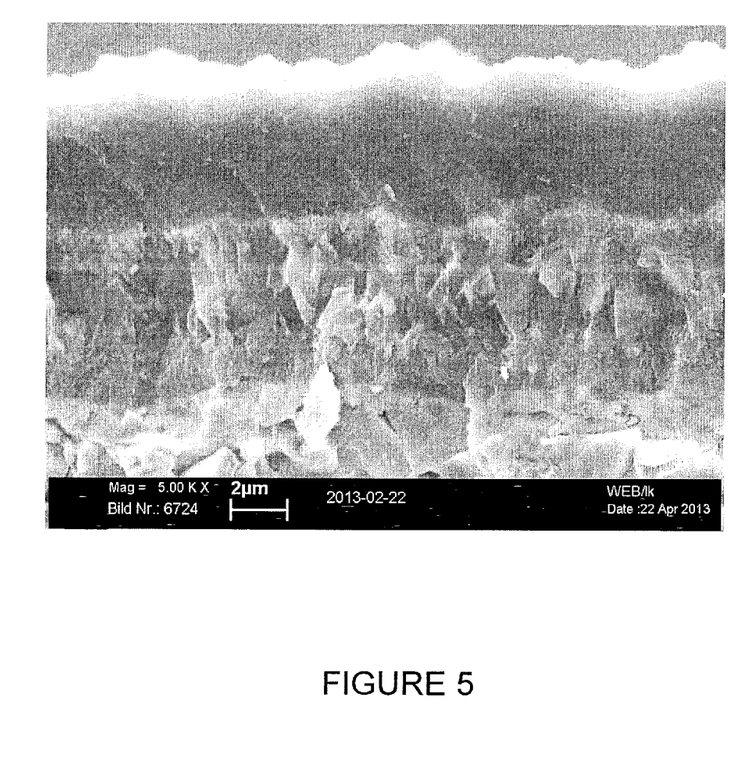
FIG. 5 is a cross-sectional scanning electron microscopy (SEM) image of a coated cutting insert according to one embodiment described herein.
Figure 6:
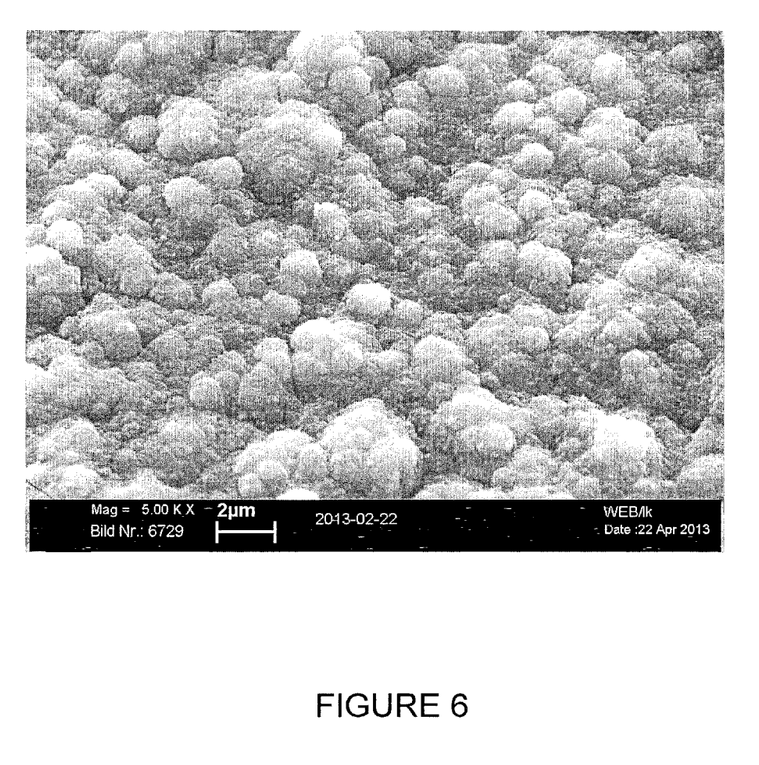
FIG. 6 is a SEM image of a refractory layer surface of a coating according to one embodiment described herein.

FIG. 5 is a cross-sectional SEM image of the resulting coated cutting insert at a magnification of 5000×. Further, FIG. 6 is a top-down SEM image of the refractory layer surface at a magnification of 5000×.

Example 2

Coated Cutting Tool

A coated cutting tool described herein was produced by placing a cemented tungsten carbide (WC—Co) cutting insert substrate [ANSI standard geometry SPHX1205PCERGPB] into a Bernex 200 CVD reactor. The cutting insert comprised 6 wt. % cobalt binder with the balance WC grains of size 1-5 μm. A coating was deposited on the cutting insert according to the parameters of Example 1.

TABLE XII

CVD Deposition Steps of Coating

| Process Step | $H_2$ vol. % | $N_2$ vol. % | $TiCl_4$ vol. % | $CH_3CN$ vol. % | $CH_4$ vol. % | $AlCl_3$ vol. % | $CO_2$ vol. % | CO vol. % | $ZrCl_4$ vol. % | $NH_3$ vol. % | HCl vol. % |
|---|---|---|---|---|---|---|---|---|---|---|---|
| TiN | Bal. | 40-48 | 0.5-2 | — | — | — | — | — | — | — | — |
| MT-TiCN | Bal. | 25-40 | 0.5-2 | 0.1-1.5 | — | — | — | — | — | — | — |
| TiOCN | Bal. | 15-42 | 0.5-2 | — | 2-4 | — | — | 0.3-2 | — | — | — |
| ZrCN | Bal. | 25-35 | — | 0.1-1.5 | — | — | — | — | 0.5-3 | — | — |
| κ-$Al_2O_3$ | Bal. | 7-20 | — | — | — | 1.5-4 | 2-4 | 0-1.5 | — | — | 1-4 |
| κ-$Al_2O_3$/$ZrO_2$/$TiOx$* | Bal. | — | 0.1-1.5 | — | 3-6 | 1.5-4 | 2-5 | — | 0.1-1.5 | — | 3-6 |
| AlON/$ZrO_2$/TiON** | Bal. | — | 0.1-1.5 | — | — | 1.5-4 | 2-5 | 0-1.5 | 0.1-1.5 | 1-4 | 3-6 |

*Composite Alumina Sublayer with mixture of $Al_2O_3$, $ZrO_2$ and $TiOx$ phases
**Composite AlON Sublayer with mixture of AlON, $ZrO_2$ and TiON phases

TABLE XIII

CVD Deposition Steps of Coating

| Process Step | Temp. °C. | Pressure mbar | Time min. |
|---|---|---|---|
| TiN | 930-960 | 600-900 | 20-40 |
| MT-TiCN | 900-940 | 70-100 | 70-110 |
| TiOCN | 950-1000 | 200-500 | 30-70 |
| ZrCN | 950-1000 | 70-100 | 20-60 |
| κ-$Al_2O_3$ | 950-1000 | 70-100 | 60-150 |
| κ-$Al_2O_3$/$ZrO_2$/TiOx | 950-1000 | 70-100 | 15-60 (per sublayer) |
| AlON/$ZrO_2$/TiON | 950-1000 | 70-100 | 15-60 (per sublayer) |

The resulting multilayer coating demonstrated the properties provided in Table XIV.

TABLE XIV

Properties of CVD Coating

| Coating Layer | Thickness (μm) | Hardness (0.05HV) |
|---|---|---|
| TiN | 1.2 | — |
| MT-TiCN | 3.6 | — |
| TiOCN | 0.6 | — |
| ZrCN | 1.0 | — |
| κ-$Al_2O_3$ | 0.6 | — |
| κ-$Al_2O_3$/$ZrO_2$/TiOx† | (4×) 0.7 = (2.8) | 1700-1900 |
| AlON/$ZrO_2$/TiON† | (4×) 0.8 = (3.2) | 1900-2200 |

†Individual Sublayer Thickness

The resulting multilayer coating demonstrated properties consistent with those provided in Table XIV.

Example 3

Milling Testing

A coated cutting insert of Example 1 and Comparative cutting inserts (1 and 2) were subjected to milling testing according to the parameters below. Comparative coated cutting inserts (1 and 2) comprised the same cemented WC substrate as Example 1 and exhibited the following CVD coating architectures:
Comparative 1: TiN-(MT)-TiCN—TiCN—$Al_2O_3$—(TiCN/TiN)* (*removed after post coat)
Comparative 2: TiN-(MT)TiCN—($Al_2O_3$/$ZrO_2$/$TiO_x$)—(AlON/$ZrO_2$/TiON)
For the milling testing, two cutting edges were tested for each coated insert of Example 1, Comparative 1 and Comparative 2.
Milling Parameters
Workpiece—4140 Steel
Lead Angle—45°
Cutting Speed—820 sfm
RPM—1171
Feed Rate—12.881 ipm
Axial Depth of Cut—0.098 inch
Radial Depth of Cut—1.969 inch
Coolant—None
The average milling lengths (mm) until end of life (EOL) of the coated inserts are provided in Table XV. EOL was registered by failure modes of flank wear (VB)>0.3 mm and/or microchipping on the cutting edge determined by visual inspection.

TABLE XV

Milling Test Results (Length - mm)

| Coated Cutting Insert | Cutting Edge 1 | Cutting Edge 2 | Average |
|---|---|---|---|
| Example 1 | 160 | 103 | 131.5 |
| Comparative 1 | 54 | 43 | 63.5 |
| Comparative 2 | 63 | 91 | 77 |

Figure 7:
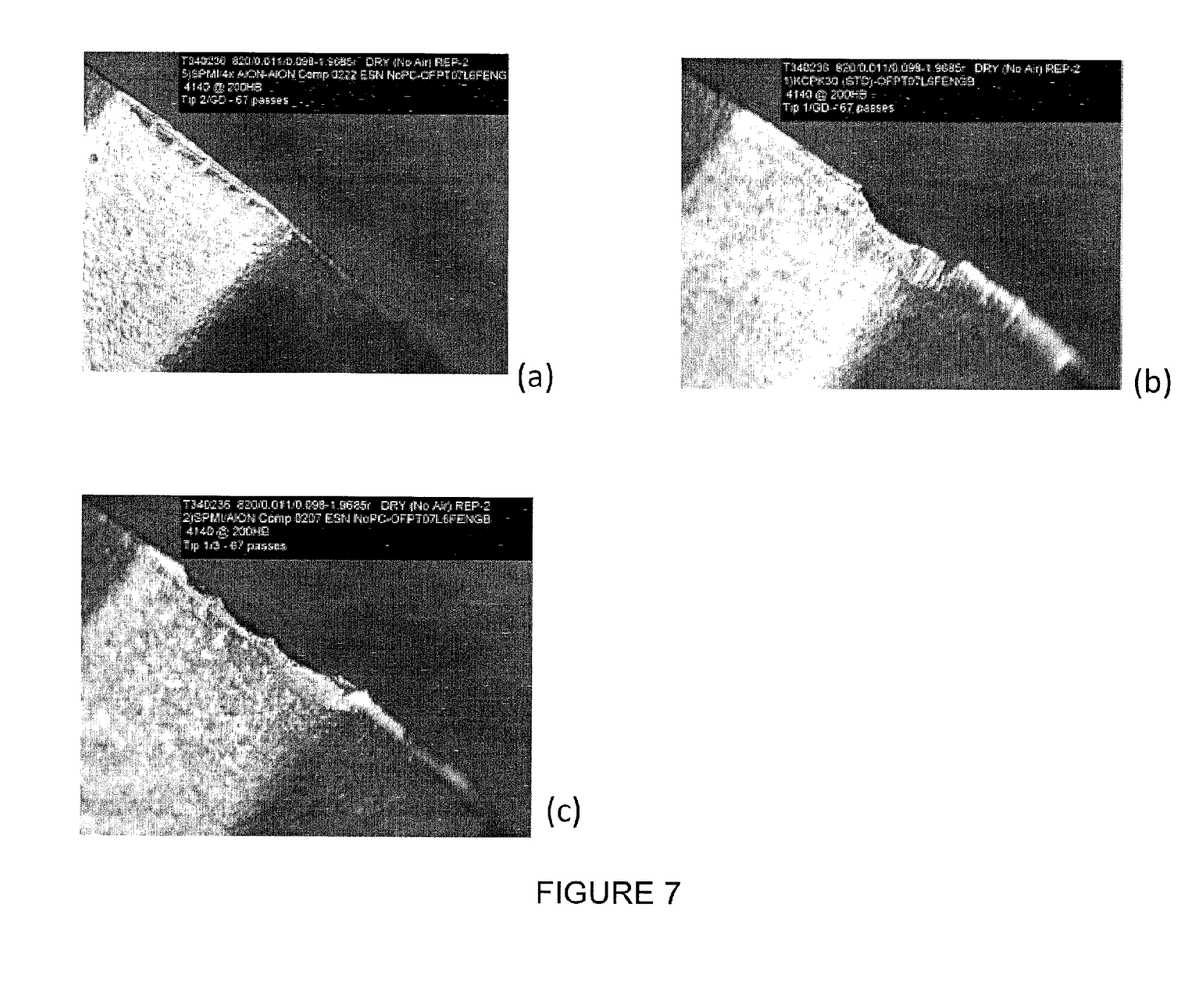
FIG. 7(a) is a photograph of a cutting insert having a coating architecture described herein, the cutting insert having been subjected to milling testing as set forth in Example 3.
FIGS. 7(b)-(c) are photographs of comparative cutting inserts having been subjected to milling testing as set forth in Example 3.

As provided in Table XV, the coated cutting insert of Example 1 having an architecture described herein outperformed Comparative inserts 1 and 2, demonstrating at least a 100 percent increase in lifetime. Moreover, the coated cutting insert of Example 1 exhibited superior resistance to cracking and chipping in response to thermal cycling. FIG. 7 provides photographs of the cutting insert of Example 1 (a) and Comparative inserts 1 and 2 (b and c respectively) after 67 passes in the milling testing. As illustrated in FIG. 7, the cutting insert of Example 1 displayed significantly less cracking and chipping relative to Comparative cutting inserts 1 and 2.

Example 4

Milling Testing

A coated cutting insert of Example 2 and Comparative cutting inserts (3 and 4) were subjected to milling testing according to the parameters below. Comparative coated cutting inserts (3 and 4) comprised the same cemented WC substrate as Example 1 and exhibited the following CVD coating architectures:
Comparative 1: TiN-(MT)-TiCN—TiCN—Al$_2$O$_3$—(TiCN/TiN)* (*removed after post coat)
Comparative 2: TiN-(MT)TiCN—ZrCN—(Al$_2$O$_3$/ZrO$_2$/TiO$_x$)—(AlON/ZrO$_2$/TiON)
For the milling testing, two cutting edges were tested for each coated insert of Example 2, Comparative 3 and Comparative 4.
Milling Parameters
Workpiece—Gray Cast Iron (Class 40)
Lead Angle—0°/90°
Cutting Speed—1312 sfm
RPM—2021
Feed Rate—16.168 ipm
Axial Depth of Cut—0.098 inch
Radial Depth of Cut—1.969 inch
Coolant—None The average milling lengths (mm) until end of life (EOL) of the coated inserts are provided in Table XVI. EOL was registered by failure modes of flank wear (VB)>0.3 mm and/or microchipping on the cutting edge determined by visual inspection.

TABLE XVI

Milling Test Results (Length - mm)

| Coated Cutting Insert | Cutting Edge 1 | Cutting Edge 2 | Average |
|---|---|---|---|
| Example 2 | 77 | 65 | 71 |
| Comparative 3 | 69 | 49 | 59 |
| Comparative 4 | 76 | 63 | 69.5 |

As provided in Table XVI, the coated cutting insert of Example 2 having an architecture described herein outperformed Comparative inserts 3 and 4, exhibiting at least a 20 percent increase in lifetime.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A coated cutting tool comprising:
a substrate; and
a coating adhered to the substrate, the coating including a refractory layer comprising a plurality of sublayer groups, a sublayer group comprising an aluminum oxynitride sublayer or a composite aluminum oxynitride sublayer and an alumina sublayer or composite alumina sublayer.

2. The coated cutting tool of claim 1, wherein the composite aluminum oxynitride sublayer comprises an aluminum oxynitride phase and a metal oxide phase comprising one or more oxides of metallic elements of Group IVB of the Periodic Table.

3. The coated cutting tool of claim 2, wherein the metal oxide phase comprises ZrO$_2$, HfO$_2$ or mixtures thereof.

4. The coated cutting tool of claim 2, wherein the composite aluminum oxynitride sublayer further comprises a metal oxynitride phase in addition to the aluminum oxynitride phase and metal oxide phase, the metal oxynitride phase comprising at least one oxynitride of a metallic element selected from Group IVB of the Periodic Table.

5. The coated cutting tool of claim 4, wherein the metal oxynitride phase is TiON.

6. The coated cutting tool of claim 1, wherein the composite alumina sublayer comprises an alumina phase and a metal oxide phase comprising one or more oxides of metallic elements of Group IVB of the Periodic Table.

7. The coated cutting tool of claim 6, wherein the metal oxide phase is formed of zirconia, hafnia or mixtures thereof.

8. The coated cutting tool of claim 7, wherein the metal oxide phase further comprises titanium oxide.

9. The coated cutting tool of claim 1, wherein the composite alumina layer is formed of alumina doped with one or more metallic elements selected from Group IVB of the Periodic Table.

10. The coated cutting tool of claim 9, wherein the alumina is doped with zirconium, titanium or mixtures thereof in an amount of 0.01-5 wt. % of the composite alumina sublayer.

11. The coated cutting tool of claim 1, wherein the sublayer groups are adjacent to one another.

12. The coated cutting tool of claim 1, wherein the refractory layer comprises at least four sublayer groups.

13. The coated cutting tool of claim 1, wherein at least one sublayer group is formed of the aluminum oxynitride sublayer and composite alumina sublayer.

14. The coated cutting tool of claim 1, wherein at least one sublayer group is formed of the aluminum oxynitride sublayer and alumina sublayer.

15. The coated cutting tool of claim 1, wherein a first sublayer group comprises an aluminum oxynitride sublayer or a composite aluminum oxynitride sublayer and a composite alumina sublayer and a second sublayer group comprises a composite aluminum oxynitride sublayer and an alumina sublayer.

16. The coated cutting tool of claim 1, wherein the aluminum oxynitride sublayer, composite aluminum oxynitride sublayer, alumina sublayer and composite alumina sublayer each have thickness less than 1 μm.

17. The coated cutting tool of claim 1, wherein the aluminum oxynitride sublayer, composite aluminum oxynitride sublayer, alumina sublayer and composite alumina sublayer each have a thickness of 0.1 μm to 0.8 μm.

18. The coated cutting tool of claim 16, wherein the refractory layer has a thickness of 5 μm to 25 μm.

19. The coated cutting tool of claim 16, wherein the refractory layer has a thickness of 6 μm to 15 μm.

20. The coated cutting tool of claim 1, wherein the composite alumina sublayer or the alumina sublayer has a hardness (HV0.05) less than the composite aluminum oxynitride layer.

21. The coated cutting tool of claim 1 further comprising one or more inner layers between the refractory layer and the substrate.

22. The coated cutting tool of claim 21, wherein an inner layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

23. The coated cutting tool of claim 22, wherein the one or more inner layers are selected from the group consisting of TiN, TiCN, TiOCN, ZrCN and alumina.

24. The coated cutting tool of claim 1, wherein the substrate is cemented carbide or cermet.

25. A coated cutting tool comprising:
a substrate; and
a coating adhered to the substrate, the coating including a refractory layer comprising a plurality of sublayer groups, a sublayer group comprising a composite aluminum oxynitride sublayer and an alumina sublayer or composite alumina sublayer.

26. The coated cutting tool of claim 25, wherein the composite aluminum oxynitride sublayer comprises an aluminum oxynitride phase and a metal oxide phase comprising one or more oxides of metallic elements of Group IVB of the Periodic Table.

27. The coated cutting tool of claim 26, wherein the metal oxide phase comprises $ZrO_2$, $HfO_2$ or mixtures thereof.

28. The coated cutting tool of claim 26, wherein the composite aluminum oxynitride sublayer further comprises a metal oxynitride phase in addition to the aluminum oxynitride phase and metal oxide phase, the metal oxynitride phase comprising at least one oxynitride of a metallic element selected from Group IVB of the Periodic Table.

29. The coated cutting tool of claim 28, wherein the metal oxynitride phase is TiON.

30. The coated cutting tool of claim 25, wherein the sublayer group comprises the composite alumina sublayer.

31. The coated cutting tool of claim 30, wherein the composite alumina sublayer comprises an alumina phase and a metal oxide phase comprising one or more oxides of metallic elements of Group IVB of the Periodic Table.

32. The coated cutting tool of claim 31, wherein the metal oxide phase is formed of zirconia, hafnia or mixtures thereof.

33. The coated cutting tool of claim 32, wherein the metal oxide phase further comprises titanium oxide.

34. The coated cutting tool of claim 30, wherein the composite alumina layer is formed of alumina doped with one or more metallic elements selected from Group IVB of the Periodic Table.

35. The coated cutting tool of claim 34, wherein the alumina is doped with zirconium, titanium or mixtures thereof in an amount of 0.01-5 wt. % of the composite alumina sublayer.

36. A coated cutting tool comprising:
a substrate; and
a coating adhered to the substrate, the coating including a refractory layer comprising a plurality of sublayer groups, a sublayer group comprising an aluminum oxynitride sublayer or a composite aluminum oxynitride sublayer and a composite alumina sublayer.

37. The coated cutting tool of claim 36, wherein the composite alumina sublayer comprises an alumina phase and a metal oxide phase comprising one or more oxides of metallic elements of Group IVB of the Periodic Table.

38. The coated cutting tool of claim 37, wherein the metal oxide phase is formed of zirconia, hafnia or mixtures thereof.

39. The coated cutting tool of claim 38, wherein the metal oxide phase further comprises titanium oxide.

40. The coated cutting tool of claim 36, wherein the composite alumina layer is formed of alumina doped with one or more metallic elements selected from Group IVB of the Periodic Table.

41. The coated cutting tool of claim 40, wherein the alumina is doped with zirconium, titanium or mixtures thereof in an amount of 0.01-5 wt. % of the composite alumina sublayer.

* * * * *